United States Patent [19]

Bains, Jr.

[11] 4,451,797

[45] May 29, 1984

[54] AGC CONTROLLER FOR PULSED SYSTEM

[75] Inventor: James A. Bains, Jr., Pearland, Tex.

[73] Assignee: AMF Inc., White Plains, N.Y.

[21] Appl. No.: 352,829

[22] Filed: Feb. 26, 1982

[51] Int. Cl.³ .............................................. H03G 3/20
[52] U.S. Cl. .................................. 330/134; 330/278; 330/281; 73/631
[58] Field of Search .......................... 73/631; 128/660; 330/127, 129, 134, 138, 141, 281, 278; 367/65, 98; 375/98; 455/247

[56] References Cited

U.S. PATENT DOCUMENTS 4,248,091 2/1981 Hashiguchi ........................... 73/631

*Primary Examiner*—James B. Mullins
*Attorney, Agent, or Firm*—David E. Dougherty; John H. Gallagher

[57] ABSTRACT

This invention relates to automatic gain control (agc) circuitry and more particularly to circuitry for supplying respective automatic gain control signals to an amplifier that repeatedly receives a given sequence of signals. Each one of the signals in each sequence is sampled and compared with a reference voltage in a respective feedback loop. The respective agc loops are coupled to the amplifier in a predetermined sequence to control the gain of the amplifier in a desired manner. The steps in this predetermined sequence are initiated by an external trigger and by the receipt of the signals to be controlled.

10 Claims, 7 Drawing Figures

AGC CONTROLLER FOR PULSED SYSTEM

This invention is particularly useful for providing appropriate automatic gain control signals to a controllable gain amplifier that receives successive series of pulsed signals. A plurality of agc feedback loops is provided, one for each pulse of a sequence. Each loop functions during each sequence to sample the peak magnitude of the amplifier to properly condition the amplifier to receive the corresponding pulse in the next sequence of pulses.

The agc circuitry of this invention is useful in pulsed ultrasonic nondestructive inspection systems that inspect the wall of a pipe for anomalies and/or wall thickness, for example. In such systems, a pulse of ultrasonic energy propagates from one surface of the pipe wall to the opposite wall surface where it is reflected back to the first surface. An anomaly such as an inclusion in the wall of the pipe also will cause a portion of the ultrasonic energy to be reflected back to the first surface. The wall thickness is determined as a function of the round trip propagation time of the ultrasonic energy between the two surfaces. Sometimes the time measurement is made between the "main bang", i.e., the time that the pulse of ultrasonic energy first is coupled into the first surface of the pipe wall, and the first echo pulse to be received from the back surface of the wall. In some situations it is more convenient to measure the time between the first and second echoes. Because the second echo pulse is attenuated during its second round trip propagation between the first and second surfaces, its magnitude is usually less than that of the first echo. Accordingly, it is desirable to have a receiving system that has characteristics that may be optimized for the first echo and that may be switched to an optimum condition for the second echo.

SUMMARY OF THE INVENTION

The above described desirable characteristic is achieved in the present invention by providing a plurality of parallel branches in an agc feedback loop for a controllable gain amplifier and selectively switching from one branch of the loop to the other in response to detection of the successively received echoes. The agc loop with the plurality of branches that may be selectively coupled therein may be considered to be a plurality of selectable agc loops. The agc controller of this invention is used with a system that detects the time at which pulses (echoes) occur. The peak value of a detected pulse is compared to a reference voltage, and the act voltage is changed by an amount proportional to the difference between the pulse (echo) height and the reference voltage. The new agc voltage is held in a capacitor in a selectable branch of the agc loop until it is needed for the next similar pulse of the sequence. Therefore, the pulse (echo) height is controlled to be substantially equal to the reference voltage. Other pulses in the sequence can be handled separately, since the process of changing the agc voltage requires less time than the time between pulses. Therefore, any number of pulses in a sequence can be controlled independently, and the agc level for any pulse is not dependent on the repetition rate of the sequence.

BRIEF DESCRIPTION OF THE DRAWINGS

The invention will be described by referring to the accompanying drawings wherein.

DESCRIPTION OF PREFERRED EMBODIMENT

Figure 1:
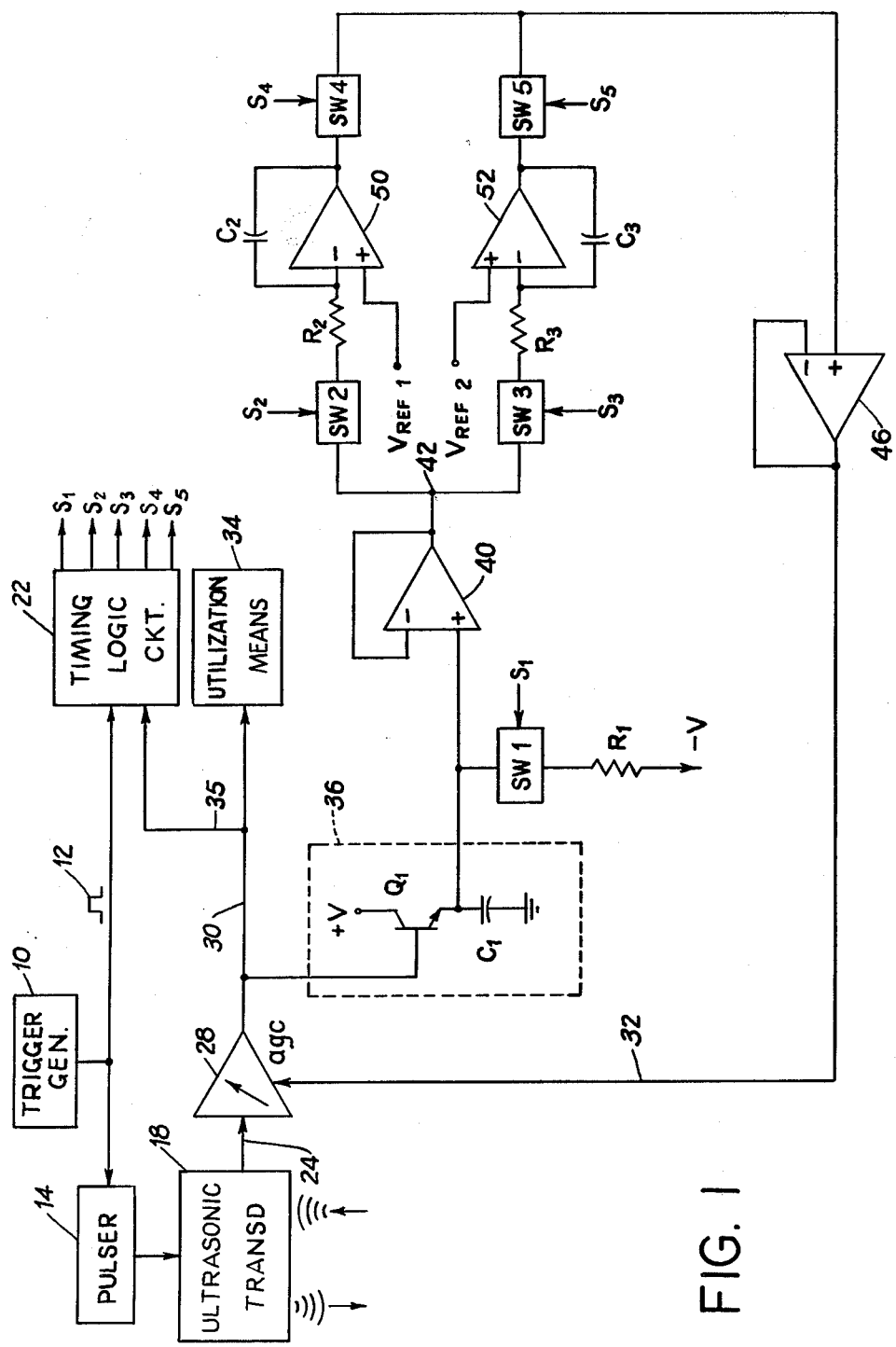
FIG. 1 is a simplified block and schematic diagram of the improved automatic gain control circuitry of this invention.

The invention will be described in connection with a pulse echo ultrasonic inspection system which is illustrated in simplified form in FIG. 1. A trigger generator 10 produces a basic timing pulse 12 that triggers a high power pulser 14. Pulser 14 is coupled to ultrasonic transducer 18 which responds to a high power pulse to produce an ultrasonic inspection pulse that is coupled into the sample to be inspected, which will be assumed to be a pipe wall in this example. Trigger generator 10 also is coupled to a timing logic circuit 22 which responds to trigger pulse 12 and to detected echoes to produce the series of timing or switching waveforms S1–S5 that are illustrated in FIGS. 2b–2f.

Ultrasonic pulses that are coupled into the test sample propagate through the wall of the pipe, are reflected from the far surface of the pipe and are received back at transducer 18. Although not illustrated, appropriate transmit/receive apparatus will be used to properly direct the transmitted and received electrical pulses, as is conventional in the art.

As illustrated in FIG. 2a, transducer 18 will respond to the high power pulse from pulser 14 and will produce a relatively large and broad main bang #1. Some time later transducer 18 will respond to the ultrasonic energy that is received from the far surface of the pipe and will produce a first echo pulse on output line 24. Some of the ultrasonic energy that is received back at the first surface will again be reflected to and from the far surface and will again be received back at transducer 18. In FIG. 2a, the second echo following main bang #1 is the output of transducer 18 in response to this double round trip propagation of ultrasonic energy within the wall of the pipe.

The signals having the waveforms of FIG. 2a are coupled on line 24 to controllable gain amplifier 28. Line 30 represents the output of amplifier 28 and line 32 represents the automatic gain control (agc) feedback input to amplifier 28. Output line 30 is coupled to a utilization means 34 which may be any conventional means for displaying and/or recording, or otherwise utilizing, the output signals of amplifier 28. For example, utilization means 34 might be an oscilloscope, or magnetic recording means. The output of amplifier 28 also is coupled on line 35 to timing logic circuit 22. The operation of timing logic circuit 22 will be discussed in further detail below.

The output signal of controllable gain amplifier 28 is selectively sampled by means of sampling circuit 36 which is comprised of npn transistor Q1 whose base terminal is connected to output line 30 of amplifier 28. The collector terminal of transistor Q1 is connected to a positive voltage supply and the emitter terminal is connected to the first side of storage capacitor C1. The other side of capacitor C1 is grounded. The first side of capacitor C1 also is connected to the input of switch SW-1 and to the input of buffer amplifier 40. When switch SW-1 is closed it provides a discharge path for capacitor C1 through resistor R1. Switch SW-1 provides substantially infinite impedance when open.

Buffer amplifier 40 is characterized by a very high input impedance and unity gain. With sampling switch SW-1 open, amplifier 40 provides a very long time constant discharge path for capacitor C1, thereby effectively sampling any charge on the capacitor without allowing the capacitor to appreciably discharge.

The operation of switch SW-1 is under control of the switching waveform S1, FIG. 2b, that is produced by timing logic circuit 22. It will be assumed that the positive going pulses of the waveform of FIG. 2b will cause switch SW-1 to close and that the switch will be open at all other times. Assuming that switch SW-1 is open, the next output signal from amplifier 28 will cause the capacitor to hold a charge that is a function of the peak magnitude of the output signal. Because switch SW-1 is open and the input impedance of buffer amplifier 40 is very high, capacitor C1 will retain its charge, thus functioning as a peak detector.

Unity gain buffer amplifier 40 transfers the voltage stored on capacitor C1 to junction point 42 which is a common input to two branches of the agc feedback loop. The first branch includes series connected input switch SW-2, integrating operational amplifier 50 with its input resistor R2 and integrating capacitor C2, and series connected output switch SW-4. The respective switching waveforms S2 and S4, FIGS. 2c and 2e, control the operations of switches SW-2 and SW-4. Again, and in discussions to follow, it will be assumed that positive portions of the waveforms cause the switches to close and that the switches are open at all other times.

The second branch includes switch SW-3, integrating operational amplifier 52 with its input resistor R3 and integrating capacitor C3, and series connected output switch SW-5. Switching waveforms S3 and S5, FIGS. 2d and 2f, control respective switches SW-3 and SW-5.

Integrating operational amplifiers 50 and 52 function as comparators to compare their input signals switches in through their respective input switches SW-2, SW-3 (the voltage held on capacitor C1) with respective predetermined reference voltages Vref1 and Vref2. The output of an integrating amplifier, when the input switch is closed, changes at a rate which is proportional to the difference between the reference voltage and input signal. The output voltage is held when the input switch is opened to disconnect the input voltage, and irrespective of whether the corresponding output switch is open or closed. Of course, when the respective output switch is closed the output signal is coupled through a second high input impedance buffer amplifier 46 the the agc input of controllable gain amplifier 28. This agc signal causes amplifier 28 to assume a gain characteristic which will cause the next occurring input signal to appear on output line 30 with a predetermined magnitude that is some function of the corresponding reference voltage Vref1 or Vref2.

In the operation of the system of FIG. 1, reference first will be made to the waveforms of the received signals at the input of controllable gain amplifier 28, FIG. 2a, and the waveforms of the switching signal S1, FIG. 2b, that controls the sampling of signals by capacitor C1 in sampling circuit 36. For discussion purposes it will be assumed that all positive going signals in the waveform of FIG. 2a will cause transistor Q1 to conduct to couple capacitor C1 to the source of positive voltage +V. In response to trigger pulse 12, timing logic circuit 22 produces the relatively long duration pulse 60 of FIG. 2b. Pulse 60 of switching waveform S1 closes switch SW-1 to connect resistor R1 to capacitor C1. With this connection capacitor C1 does not peak detect the main bang #1.

After a time duration that is sufficient for the main bang #1 signal to be concluded, switching signal S1 goes low and switch SW-1 opens.

The output signal of amplifier 28 that corresponds to the 1st echo will be peak detected by sampling circuit 36 and the sampled signal will be held on capacitor C1. The 1st echo signal through amplifier 28 also is coupled over lead 35 to timing logic circuit 22 which responds thereto to produce the positive pulse 62 of waveform S2, FIG. 2c. Positive pulse 62 closes input switch SW-2. Integrating operational amplifier 50 compares the input signal passed by switch SW-2 (output signal corresponding to 1st echo signal) with the reference voltage Vref1 and produces an outut signal which changes by an amount which is proportional to the difference between the sampled signal and the reference voltage. Integrating operational amplifier 50 functions to retain or hold its output voltage level after input switch SW-2 opens.

Referring to the switching waveform S4, FIG. 2e, it is seen that output switching waveform S4 is high during the time that the first echo signal is received by amplifier 28. Consequently, output switch S4 is closed during this time and the output voltage of integrating operational amplifier 50 is coupled through the second buffer amplifier 46 to the agc input of amplifier 28. At the termination of pulse 62 in switching waveform S2, timing logic circuit 22 produces positive pulse 64 of switching waveform S1, FIG. 2b. Pulse 64 closes switch SW-1 which connects resistor R1 to capacitor C1, thereby discharging capacitor C1 so that it may be conditioned to sample the output of amplifier 28 that corresponds to the next received 2nd echo signal.

Simultaneously with this closing of switch SW-1, switching waveform S4 goes low to open output switch SW-4. Switching waveform S5 goes high to close output switch SW-5. Consequently, integrating operational amplifier 50 is disconnected from the agc feedback loop and operational amplifier 52 is inserted into the loop, i.e., its output is applied on line 32 to the agc input of amplifier 28.

With the circuit of FIG. 1 in the condition just described, the 2nd echo signal following main bang #1 is received by amplifier 28 and the magnitude of the output signal on line 30 is a function of the agc signal produced by operational amplifier 52. The peak output of amplifier 28 (the 2nd echo pulse) is held by sampling circuit 36 since switch SW-1 is open at this time. The 2nd echo signal also is coupled from the output line 30 of amplifier 28 to timing logic circuit 22 which responds thereto to produce positive pulse 66 of switching waveform S3, FIG. 2d. Pulse 66 of switching waveform S3 closes switch SW-3 to effectively couple the input of operational amplifier 52 to sampling capacitor C1 which is storing the peak value of the 2nd echo signal. Integrating operational amplifier 52 compares the magnitude of the 2nd echo signal on amplifier output line 30 with the reference voltage Vref2 and produces a change in the output signal that is a function of the difference of these two signals.

Figure 2:
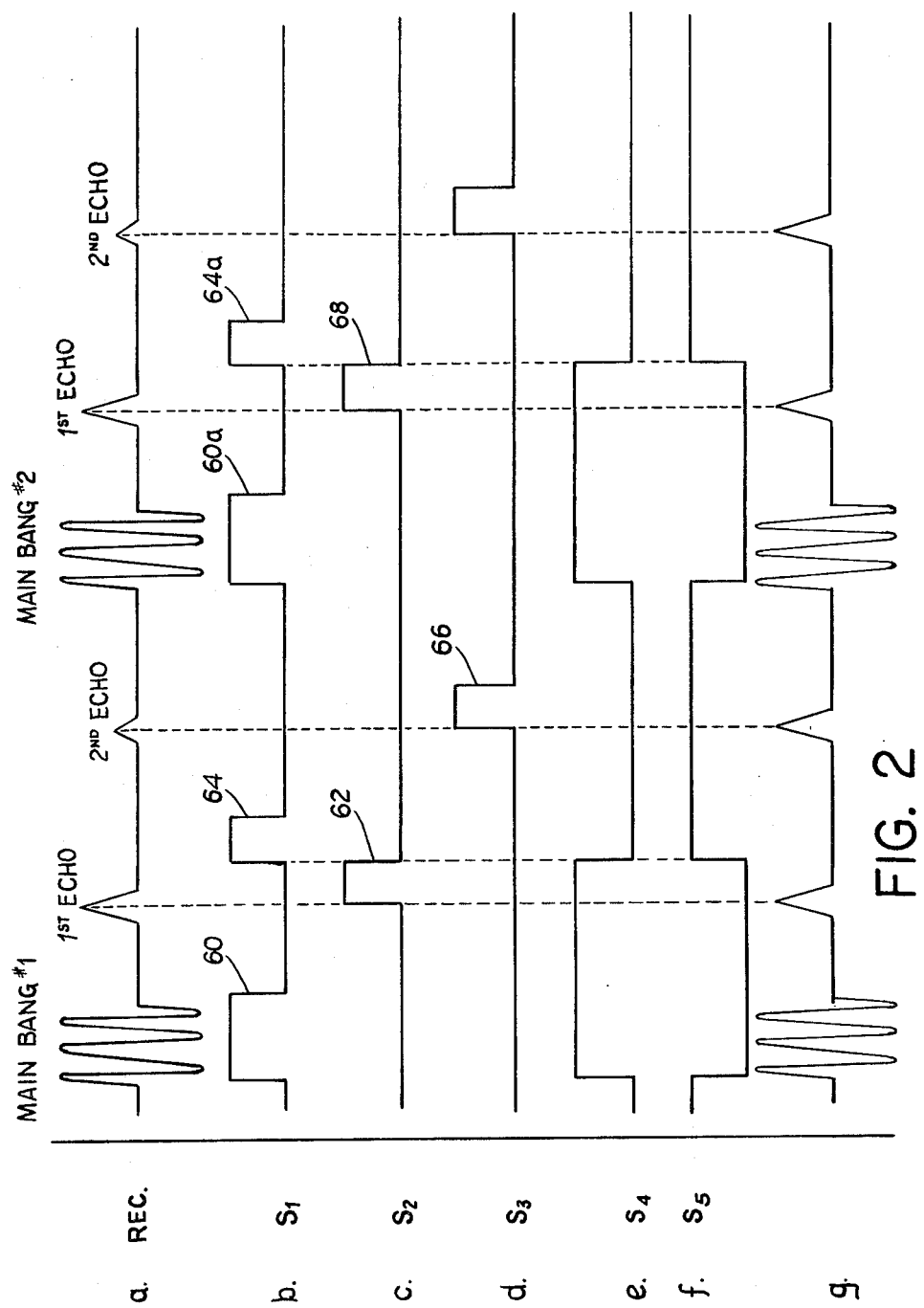
FIG. 2 is a series of simplified timing waveforms that occur at various points in the diagram of FIG. 1 and are referred to in describing the operation of FIG. 1.

After the 2nd echo signal and pulse 66 of switching waveform S3 terminate, the system stays in the condition illustrated in FIG. 2 until the next trigger pulse 12 is generated and the main bang #2 is produced. As will be explained below, the next trigger pulse 12 causes switching waveform S4 to go high and switching waveform S5 to go low. The agc signal from integrating operational amplifier 50 now is connected on line 32 to the agc input of amplifier 28 and the amplifier is conditioned to receive the first echo signal following main bang #2. The system of FIG. 1 responds to the subsequently received sequence comprised of the main bang signal, the 1st echo signal and the 2nd echo signal in the same manner previously described to provide a respective agc signal for a corresponding one of the received echo signals.

Each time an integrating operational amplifier 50 or 52 is switched to the peak detector circuit 36 it makes a magnitude comparison of a selected pulse in the sequence of pulses against a reference signal. The integrating operational amplifier changes its output voltage to compensate for any error in the echo amplitude. Time constants R2, C2 and R3, C3 associated with the operational amplifiers are chosen to be long enough to prevent overcorrection of the agc voltage (which would lead to unstable or oscillatory behaviors), and short enough to allow the desired speed of response to changes in the echo amplitude. This corrected agc voltage is automatically coupled into the agc feedback loop at an appropriate time to condition the gain of amplifier 28 to receive the same given pulse of the next sequence of pulses. The circuit automatically switches in response to the successively received pulses and the respective integrating amplifier is always coupled to the agc input of amplifier 28 for the proper pulse in the sequence.

Figure 3:
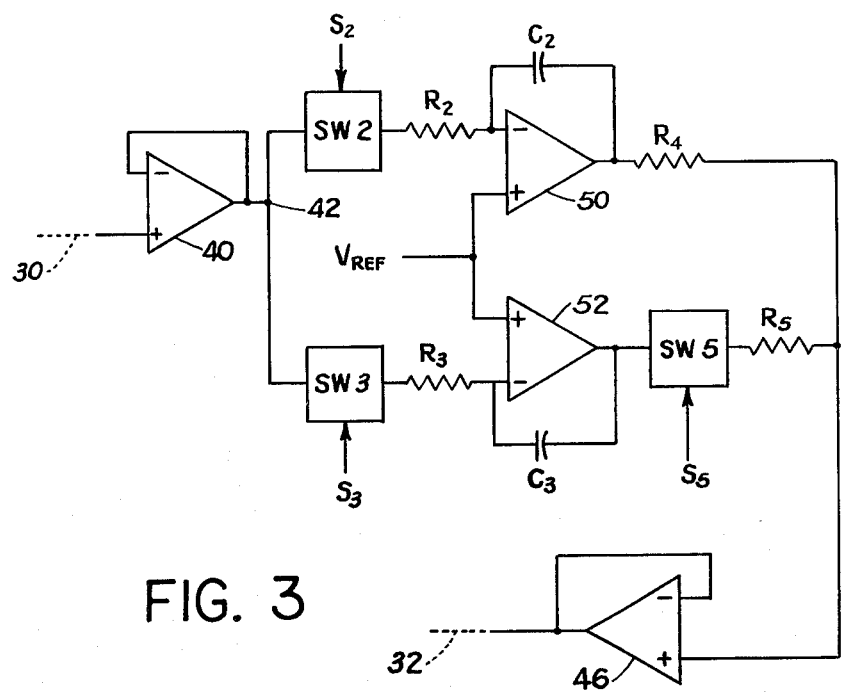
FIGS. 3 and 4 are partial system diagrams illustrating alternative embodiments of the system of FIG. 1.
Figure 4:
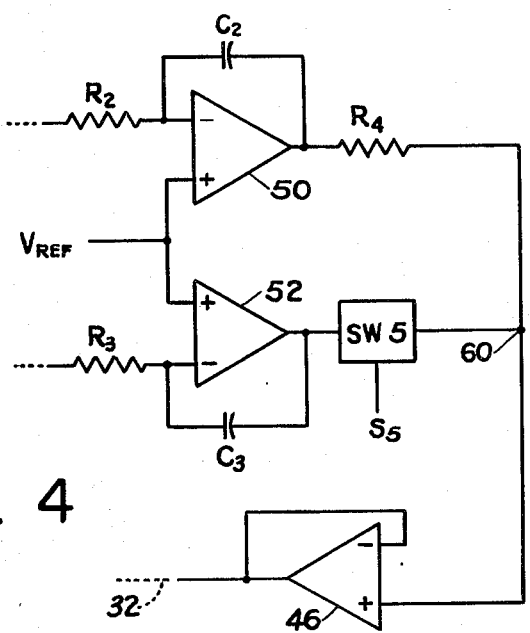

Alternative arrangements are shown in FIGS. 3 and 4. In these figures, incidentally, it has been assumed that the 1st and 2nd echoes are to be controlled to the same height (see FIG. 2g) and so only one voltage reference is used. Only the integrating operational amplifier comparators 50 and 52 and their inputs and outputs are illustrated in FIG. 3, it being understood that except for the absence of a switching waveform S4 from timing logic circuit 22, the remainder of the agc system will be substantially as illustrated in FIG. 1. Because there is no switch in the output of integrating operational amplifier 50, the outut of that amplifier is continuously coupled into the agc feedback loop. Consequently, when switch SW-5 in the output of operational amplifier 52 is open the agc signal on the loop is solely the output of amplifier 50. When output switch SW-5 of operational amplifier 52 is closed the signal input to buffer amplifier 46 will have a magnitude equal to the weighted average of the output voltages of amplifiers 50 and 52. The fact that this weighted average is used instead of just the output of amplifier 52 makes no substantial difference to the operation of the circuit.

FIG. 4 shows the special case of FIG. 3 where $R_5=0$. The agc voltages have substantially the same relation to the output voltages of the integrating amplifiers 50 & 52 as those in FIG. 1.

The details of timing logic circuit 22 now will be explained by refering to the simplified block diagram of FIG. 5 and the simplified waveform diagram of FIG. 6. For purpose of this explanation, the pulse 12' of FIG. 6a corresponds to the pulse of FIG. 1 that is coupled from the main trigger generator to timing logic circuit 22. The waveforms of FIG. 6b are derived from the signals on line 35 that couples the output of controllable gain amplifier 28 to timing logic circuit 22.

Figure 6:
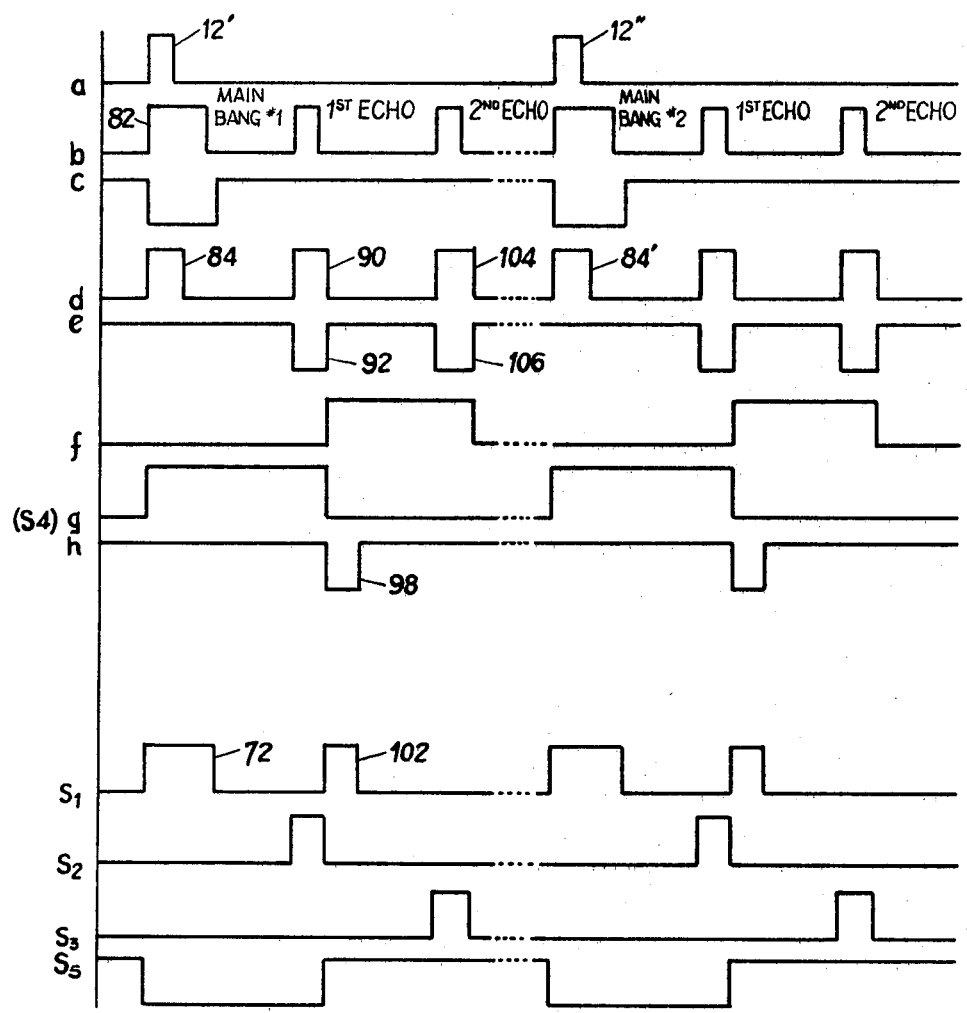
FIG. 6 is a series of waveforms that are used to explain the timing logic circuit of FIG. 5.

Trigger pulse 12' of FIG. 6a is coupled to the input of one shot 70 which produces in response thereto the longer duration pulse of FIG. 6c. This negative pulse is coupled to the top input of NAND gate G1 whose other input is high at this time. Consequently, gate G1 produces the corresponding long duration pulse 72 of switching waveform S1, FIG. 6 and FIG. 2.

Waveform c of FIG. 6 also is coupled to the clear inputs of flip flop circuits 74 and 76 to clear both of them. When cleared, their Q outputs are low and their $\bar{Q}$ outputs are high. Flip flop 74 is a set-reset flip flop and device 76 is a D-type flip flop. When a clock (CLK) input is applied to a D-type flip flop, it transfers to its Q output the state of its D input.

Positive pulse 72 on the output of gate G1 is inverted in inverter 78 and coupled to the bottom input of NAND gate G2. The other input signal on the top input of NAND gate G2 is the output of one shot 80. The input to one shot 80 is derived from the peak (position) detection of the output of controllable gain amplifier 28, as illustrated in FIG. 6b. The wide first pulse 82 of FIG. 6b corresponds to the "main bang" of the transmitted pulse. It is desired that this main bang not be coupled to the agc channels. As was explained above, pulse 72 of switching waveform S1 assures that capacitor C1 cannot store a charge during the main bang. Additionally, one shot 80 produces a pulse 84, FIG. 6d, that is coupled to the top input of NAND gate G2. The lower input signal to gate G2 is the inverted switching pulse S1 which is low at this time. Therefore, the output of NAND gate G2 will be high. This high will be inverted in inverter 86 and the low output will be applied to the top inputs of the two AND gate G3 and G4, thereby disabling both gates and causing their outputs to be low. The outputs of gates G3 and G4 are, respectively, the S3 and S2 switching signals that control the input switches SW3 and SW2 to integrating operational amplifiers 52 and 50, FIG. 1. Consequently, as required, the inputs to these integrator amplifiers are disabled during the main bang.

Following the conclusion of the main bang, the switching signal S1, FIG. 6, goes low. This low is inverted to a high by inverter 78 and the high S1 signal is applied as an enable signal to NAND gate G2.

The next event to occur is the receipt of the first echo pulse at the input to one shot 80, FIG. 6b. The pulse 90, FIG. 6d, is produced by one shot 80 and is applied to the enabled NAND gate G2 to produce the negative going pulse 92 of FIG. 6e. This pulse is inverted by inverter 86 and applied to the top inputs of both AND gates G3 and G4. At this time both flip flops 74 and 76 are still in their cleared states, with the Q output of flip flop 76 being low, FIG. 6f, and the Q output of flip flop 74 being high, FIG. 6g. As a result, gate G4 is enabled to pass the inverted pulse 92. Gate G3 is disabled and its output remains low. The inverted pulse passed by gate G4 is the first pulse of switching waveform S2, FIG. 6. The output of disabled gate G3 remains low, see waveform S3, FIG. 6.

Because flip flop 76 is clocked on the trailing edge of negative pulse 92, FIG. 6e, its condition will change after the pulse of switching waveform S2 is passed by gate G4. The clocking of flip flop 76 causes the high on its D input, FIG. 6g, to be transferred to its Q output, FIG. 6f, to be transferred to its Q output, FIG. 6f, thereby applying an enabling signal to the lower input of gate G3.

The Q output of flip flop 76 goes low and sets flip flop 74, thereby causing its Q output to go low, FIG. 6g (S4) and its Q output to go high, FIG. 6 (S5). The low Q output of flip flop 74 is coupled to AND gate G4 to disable it.

Figure 5:
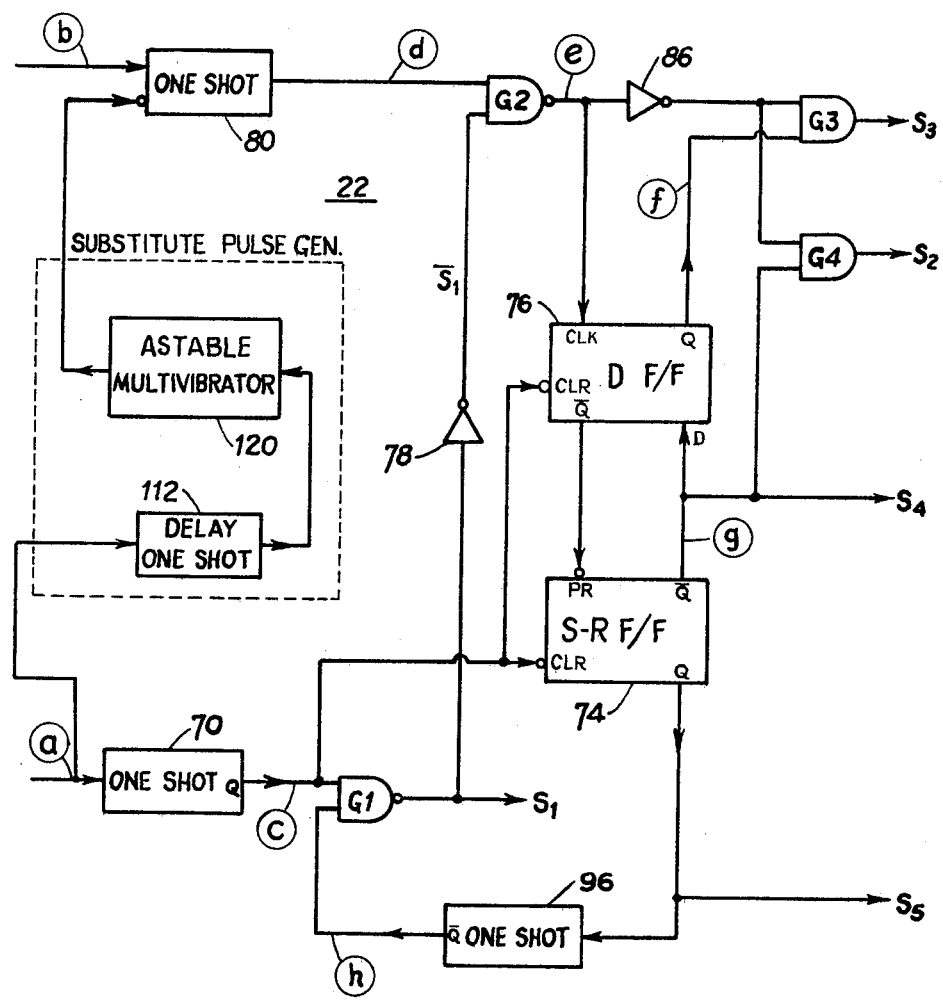
FIG. 5 is a simplified block diagram of the timing logic circuit of the system illustrated in FIG. 1.

The high Q output of flip flop 74, S5 of FIG. 6, closes switch SW5, FIG. 1, and triggers one shot 96, FIG. 5, and causes it to produce the negative going pulse 98 of FIG. 6h. This negative pulse from one shot 96 passes gate G1 and appears as pulse 102 of switching waveform S1, FIG. 6. This pulse closes switch S1 and discharges capacitor C1, FIG. 1, to prepare peak detector 36 to sample the 2nd echo that is expected to be received.

The 2nd echo pulse, FIG. 6b, is coupled to one shot 80 which produces pulse 104 in response thereto. Waveform S1 (not illustrated) is high at this time, so NAND gate G2 produces the negative going pulse 106 of FIG. 6e in response thereto. This pulse is inverted by inverter 86 and is passed by enabled gate G3, see switching waveform S3, FIG. 6.

The negative going pulse 106 of FIG. 6e is coupled to the clock input of flip flop 76 and the trailing edge of the pulse transfers the low signal at the D input, FIG. 6g, to the Q output, thereby causing a disabling signal (low of FIG. 6f) to be coupled to gate G3. At this time, the Q output of flip flop 76 is low, as is the Q output of flip flop 74, see FIGS. 6f and 6g. Consequently, both AND gates G3 and G4 are disabled. Even if another clock signal is coupled to the clock input of flip flop 76 the Q output will remain low and AND gate G3 will remain disabled because the Q output of flip flop 74 that is coupled to the D input of flip flop 76 still is low. In effect, timing logic circuit 22 is "locked up" and will not change until another trigger signal 12", FIG. 6a is coupled to one shot 70.

The next output pulse 84' from one shot 70, FIG. 6d, is coupled to the clear (CLR) input of both flip flops 74 and 76 to cause the Q output of flip flop 74 to go high and the Q output of flip flop 76 to remain low. This enables AND gate G4 and keeps AND gate G3 disabled. The circuit operation in response to the first and second echo pulses associated with main bang #2 will be as described above in connection with the corresponding echoes following main bang #1.

It is to be understood that the system of FIG. 1 need not respond in the manner described to each successively received signal. There may be one or more intervening signals that occur between desired signals, and the system would function as described for the desired signals, but not for the undesired intervening signals. In such a situation, timing logic circuit 22 would be constructed merely to receive and count the one or more intervening signals, but would produce the necessary switching signals only to correspond to the desired signals.

The response characteristics of the agc feedback loop need not be linear but may have any desired characteristic.

When the system of FIG. 1 is first turned on the trigger generator 10 and pulser 14 will be functioning, but it is quite possible that the transducer will not be on a pipe wall, for example, so that echo signals will not be received at this time. In the absence of echo signals the logic tming circuit 22 of FIG. 5 will not produce the switching signals S1 through S5 that are necessary to build up agc signals in the agc loops that include integrating operational amplifiers 50 and 52. The absence of agc signals to amplifier 28 of the system of FIG. 1 may adversely affect the operation of the system when transducer 18 is placed on a pipe wall and echo signals begin to be received by amplifier 28 that is not properly conditioned by agc signals.

Figure 7:
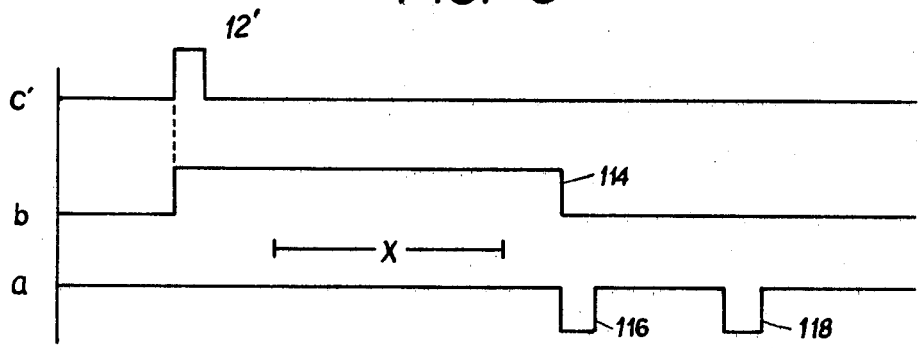
FIG. 7 is another series of waveforms that are used to explain a particular feature of the timing logic circuit of FIG. 5.

To overcome this condition, substitute pulses are generated and when no echoes are received from the transducer the substitute pulses serve the purpose of the echo pulses to produce the required switching pulses that cause the agc system of FIG. 1 to produce agc signals for amplifier 28. This feature of the logic timing circuit will be described by refering to the left side of FIG. 5. The simplified timing waveforms of FIG. 7 are used rather than showing the waveforms on FIG. 6 only because of convenience since the scale of FIG. 6 is not well suited for this purpose. The trigger pulse 12' triggers the delay one shot 112 to produce the long duration positive pulse 114 of FIG. 7b. This pulse extends beyond the time period X during which echo pulses would be expected to be received. The trailing edge of the delay pulse 114 triggers astable multivibrator 120 which produces the negative going pulses 116 and 118 that serve as substitute echo signals.

These substitute echo signals are coupled to one shot 80 which produces output pulses that are indistinguishable from echo pulses at this point in the circuit, except for their time of occurrence. If no echo pulses are received prior to pulses 116 and 118, timing logic circuit 22 will function as described above to produce the switching signals S1 through S5. If true echo signals are in fact received within the anticipated time period X, FIG. 7, the timing logic circuit of FIG. 5 will respond as described and then will "lock out" any further signals from one shot 80 after the true second echo signals of FIG. 6b is received. Consequently, the substitute echo signals are locked out and, in effect, the remainder of the timing logic circuit 22 never "sees" them.

In its broader aspects, this invention is not limited to the specific embodiment illustrated and described. Various changes and modifications may be made without departing from the inventive principles herein disclosed.

While preferred embodiment of the invention has been illustrated and described, it is to be understood that alterations and modifications may be made to the described embodiment without departing from the scope of the present invention.

I claim:

1. Apparatus for controlling the gain of a controllable gain amplifier that has a signal input and an agc input to produce output signals having predetermined magnitudes in response to respective successively occurring input signals that recur in sequence, said apparatus comprising, means for coupling said recurring successively occurring input signals to the signal input of said controllable gain amplifier, said amplifier producing corresponding successively occurring output signals in response thereto, means for providing a plurality of selectable agc loops for said amplifier, means for sampling the magnitudes of desired ones of the successively occurring output signals during each recurrence of successively occurring output signals from the amplifier, means responsive to said desired ones of the output signals from said amplifier for coupling each sampled output signals to a succession of signals to a respective one of the agc loops, means in each of said loops for producing and holding an agc signal relating to the magnitude of the sampled signal coupled thereto, means responsive to sampled amplifier output signals for coupling a respective one or more feedback loop to the agc input of said amplifier to provide an agc signal thereto that was produced by a desired signal of the previously received succession of signals that had the same relative position in the succession as the next to be received desired signal in the present succession, whereby said amplifier is properly conditioned to receive the next desired signal.

2. The apparatus claimed in claim 1 and further including, means for automatically coupling desired ones of said feedback loops to said amplifier in the temporary absence of input signals thereto.

3. Apparatus for controlling the gain of a controllable gain amplifier that has a signal input and an agc input to produce desired output signals having predetermined magnitudes in response to successively occurring input signals that recur in sequence, said apparatus comprising;

means for coupling said recurring successively occurring input signals to the signal input of said amplifier, said amplifier producing successively occurring output signals in response thereto, means for sampling the magnitudes of said successively occurring output signals, a plurality of signal holding means each selectively responsive to a respective one of said sampled signals for producing and holding a respective agc signal, means responsive to output signals of the next sequence for coupling a predetermined one or more of said signal holding means to the agc input of the amplifier to provide an agc signal or the next to be received input signal whose position in the sequence corresponds to that of the signal that produces the holding signal that is coupled to the agc input.

4. The apparatus claimed in claim 3 wherein said plurality of signal holding means comprises;

a plurality of integrating operational amplifiers providing a plurality of parallel paths coupled to said sampling means, each integrating operational amplifier operating to compare the magnitude of a respective sampled signal with a reference voltage.

5. The apparatus claimed in claim 4 wherein said sampling means is coupled to said plurality of signal holding means by means that includes a respective signal switching means coupling each operational amplifier to said sampling means, and means responsive to said amplifier output signals for producing a plurality of switching signals for controlling said switching means.

6. The apparatus claimed in claim 5 wherein said means for coupling the signal holding means to the agc input of the controllable gain amplifier comprises;

switch means for selectively connecting said agc input to the output of a predetermined one or more operational amplifier.

7. The apparatus claimed in claim 6 wherein the means for selectively connecting said agc input to the outputs of said operational amplifiers includes;

respective switch means connected to the output of each of said plurality of operational amplifiers.

8. The apparatus claimed in claim 6 wherein the means for selectively connecting said agc input to the outputs of said operational amplifiers includes;

resistor means connected to the output of one or more of the outputs of said operational amplifiers, and switch means connected to the output of at least one of said operational amplifiers.

9. The apparatus claimed in claim 3 and including means for preventing said sampling means from maintaining a sampled signal except in response to desired input signals.

10. Apparatus for controlling the gain of a controllable gain amplifier that has a signal input and an agc input to produce output signals having predetermined magnitudes in response to respective successive occurring first and second input signals that recur in sequence, said apparatus comprising;

means for coupling said recurring successively occurring input signals to the signal input of said controllable gain amplifier, means for selectively sampling the magnitudes of said first and then said second input signals of each recurrence thereof, first signal holding means selectively coupled to said sampling means for producing a first continuous output signal whose magnitude is a predetermined function of the magnitude of the signal maintained at said sampling means when the holding means is coupled thereto, second signal holding means coupled to said sampling means for producing a second continuous output signal whose magnitude is a predetermined function of the magnitude of the signal maintained at said sampling means when the second holding means is coupled thereto, first switching means selectively operable on said sampling means to permit the sampling means to first sample the magnitude of the output signal of said controllable gain amplifier corresponding to said first input signal, and then to sample the output signal of the controllable gain amplifier that corresponds to the second input signal, second switching means for selectively connecting said first signal holding means to said sampling means, third switching means for selectively coupling said second signal holding means to said sampling means, timing means for producing timing signals for controlling said first switching means and for controlling the second and third switching means, respectively, to couple the first signal holding means to said sampling means only during the time the sampling means maintains a sample corresponding to the first input signal and couples said second holding means to the sampling means only during the time the sampling means maintains a sample corresponding to said second input signal, means in said first signal holding means for comparing the sampled signal corresponding to said first input signal with a first reference signal, means in said second holding means for comparing the sampled signal corresponding to said second input signal with a second reference voltage, and means selectively operable in response to said input signals for coupling a signal corresponding to the result of the comparison in said first signal holding means to the agc input of said controllable gain amplifier during the time the next first input signal is expected to be received, and for coupling the result of the comparison in said second signal holding means to the agc input of the controllable gain amplifier during the time that the next second input signal is expected to be received.

* * * * *